Aug. 8, 1967 J. MUELLER 3,335,387

LAMP SOCKET

Filed May 26, 1965

2 Sheets-Sheet 1

INVENTOR
JACOB MUELLER

BY [signature]

ATTORNEY

Aug. 8, 1967 J. MUELLER 3,335,387

LAMP SOCKET

Filed May 26, 1965

2 Sheets-Sheet 2

United States Patent Office
3,335,387
Patented Aug. 8, 1967

3,335,387

LAMP SOCKET

Jacob Mueller, Philadelphia, Pa., assignor to Sperry Rand Corporation, New York, N.Y., a corporation of Delaware Filed May 26, 1965, Ser. No. 458,871
7 Claims. (Cl. 339—17)

The invention hereinafter described and claimed has to do with lamp sockets, but more specifically to such sockets which are particularly useful for mounting signal lamps on printed circuit boards.

Printed circuit boards have become extremely popular in the manufacture of electronic equipment and are used in fantastic numbers in modern computers. Because of this, considerable time has been spent in the design of components to be mounted on these boards so that they can be assembled with an absolute minimum of space between the boards. In these assemblies it is often necessary to provide some convenient means quickly and easily to determine operating conditions of the equipment or even of individual boards. Frequently this is done by wiring from the boards to lights on control panels. Other methods include probe points conveniently positioned on the outer edge of the individual boards for ready access. These methods are expensive, time consuming and inconvenient.

Therefore it is the primary object of the present invention to provide a novel socket for mounting signal lamps on printed circuit boards.

Another object of the invention is to provide a lamp socket which can quickly and easily be mounted on a printed circuit board whereby operating conditions can conveniently be indicated.

A further object is the provision of such a lamp socket which can be mounted on printed circuit boards in a manner utilizing a minimum of the close spacing between boards in a multiple assembly.

Still another object of the invention is to provide a socket making it possible to mount a signal lamp on a printed circuit board with the axis of the lamp close to and substantially parallel with the plane of the board.

In accordance with the above and first briefly described, the invention comprises an elongated hollow body member of electrically insulating material having mechanical means adjacent one end for interlocking engagement with a printed circuit board through an aperture formed therein, and electrically conductive elements adjacent its other end providing the means for electrically connecting a lamp received in said hollow body member with electrically conductive wiring on said board, and for securing the other end of said body member to the board. The major dimension of the body member and the axis of the lamp lie parallel with the plane of the board with the minor dimension in a direction normal thereto.

Figure 1:
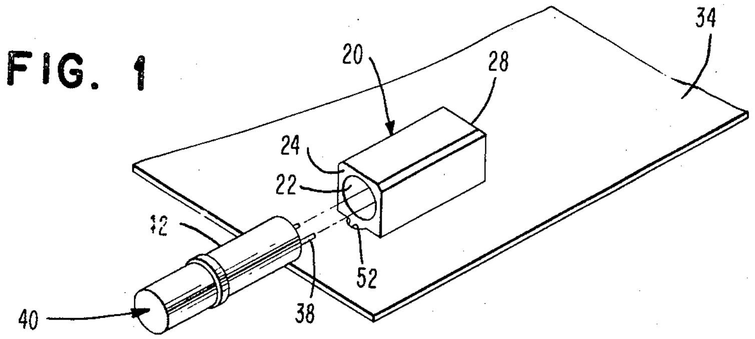
FIGURE 1 is a perspective view of the preferred form of the invention shown mounted on a fragmentary portion of a printed circuit board.

Considering now the details of the preferred embodiment shown in FIGURES 1 through 5, it is seen that the socket comprises an elongated body or socket member 20 molded of suitable electrically insulation material, such as nylon. A bore 22 extends from its front or left hand end 24 to a point 26 about one quarter of its length from the face 28, thus forming a rather thick rear end wall 29. Depending from the mid-point of its lower front edge is a hook 30 formed by a short leg portion 31 having a forwardly projecting foot 32 spaced from the body member about the thickness of the printed circuit board 34 upon which it is to be mounted.

Positioned in small spaced bores or recesses 35 in the rear wall 29 connector means, preferably in the form of a pair of electrical connectors 36 for receiving the prongs 38 of the lamp 40 when the base 42 of the lamp is inserted into the bore 22. Each connector has a tail or extension 44 which passes through a small aperture 46 and is bent downwardly through a slot 48 to extend below the bottom wall 50 of the body member, as seen more clearly in FIGURE 2.

Still with reference to this figure, it is seen that the socket can easily and quickly be mounted on the printed circuit board first by inserting the hook 30 through an aperture 52 in the board with the socket in a tilted position. Using the hook and the front edge of the hole as a pivot, the socket is rotated downwardly in a clockwise direction, as indicated by arrow 54, until the ends of tails 44 pass through the small apertures 56 in the board 34 in position to be soldered to the printed wiring 58 or the under side of the board, as shown at 61 in FIGURE 4. This may be done by hand, or automatically when the board is dip-soldered to connect the other components (not shown) to the printed wiring in accordance with well known procedures.

The vertical dimension of the socket (normal to the board) is kept at a minimum to accommodate the lamp, yet not add to the necessary spacing between boards of a multiple assembly. The socket preferably is mounted adjacent the outer end 59 of the board where it is readily visible.

While it is now clear that the above described preferred embodiment of the invention satisfies the objects of the invention, it should be understood that various modifications, such as now to be described, also fall within its scope.

Figure 6:
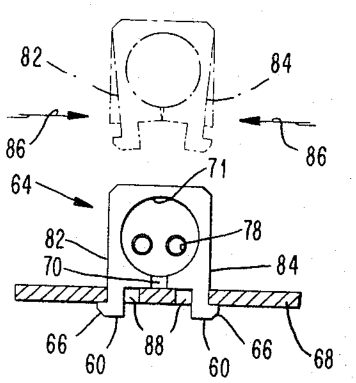
FIGURES 6 and 7 are front end and side elevational views, respectively, of a modified form of the invention with a broken line showing of the method of mounting it on a printed circuit board.
Figure 7:
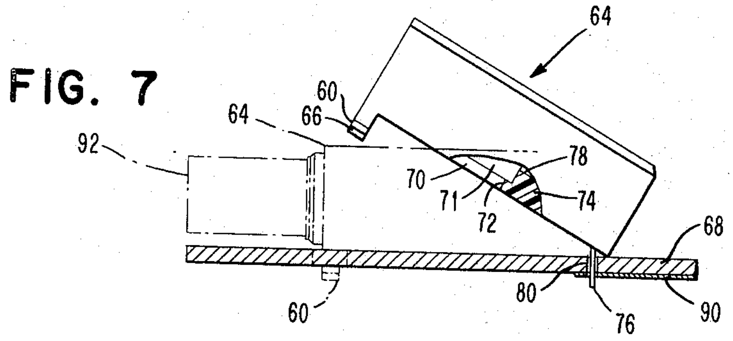
Figure 9:
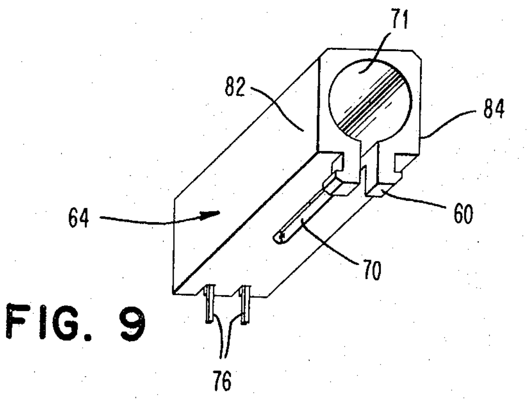
FIGURE 9 is a perspective view of the socket shown in FIGURE 8 looking upwardly from its bottom side.

For example, as seen in FIGURES 6 and 7, the hook 30 of the preferred form may be replaced by a pair of hooks 60 depending from opposite sides of the lower front edge of the body member 64. Each of the hooks includes an outwardly extending foot 66 for engaging the underside of the printed circuit board 68 when assembled therewith. A slot 70 (see FIGURE 9 also) extends rearwardly from the mid-point of the lower front edges through the length of bore 71 to a point 72 (FIGURE 7) near the rear wall 74 of the socket.

When mounting this socket on the printed circuit board 68, the tails 76 are inserted through small apertures 80 with the socket in a tilted position, as seen in the full line showing in FIGURE 7. The side walls 82 and 84 at the front of the socket are pressed inwardly—shown in broken lines in FIGURE 6—until the hooks 60 are fully aligned with the holes 88 in the board. The socket is then rotated downwardly, counter-clockwise as seen here, until it rests upon the board with the hooks extending through the holes 88. Release of the pressure on the side walls now permits them to spring outwardly to their normal condition, thus engaging the hooks 60 with the underside of the board. The tails 76 simultaneously engage the underside of the board and the wiring 90 printed thereon. Insertion of a lamp 92 in the bore 71 of the socket, will prevent removal of this socket from the board as the side walls 82 and 84 cannot be pressed inwardly to release the hooks from the board. The pressure contact of the tails 76 with the printed wiring 90 may be relied upon to effect good electrical connection, but soldering is preferred.

Figure 8:
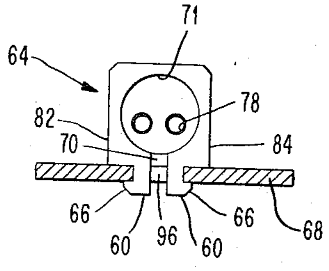
FIGURE 8 is a front elevational view of another modification of the invention showing its interlock with a printed circuit board.

While two holes 88 have been provided for receiving the hooks 60, it will be understood that one large hole or slot will also serve the same purpose. In this regard, and with reference to FIGURES 8 and 9, it is seen that the hooks 60 may project from the bottom edges at the outer end of the slot 70. In this case, when the side walls 82 and 84 are pressed inwardly both hooks easily will pass through a single aperture 96, and the hook foot extensions 66 will not extend beyond the planes of the side walls.

Figures 2, 3, 4, 5:
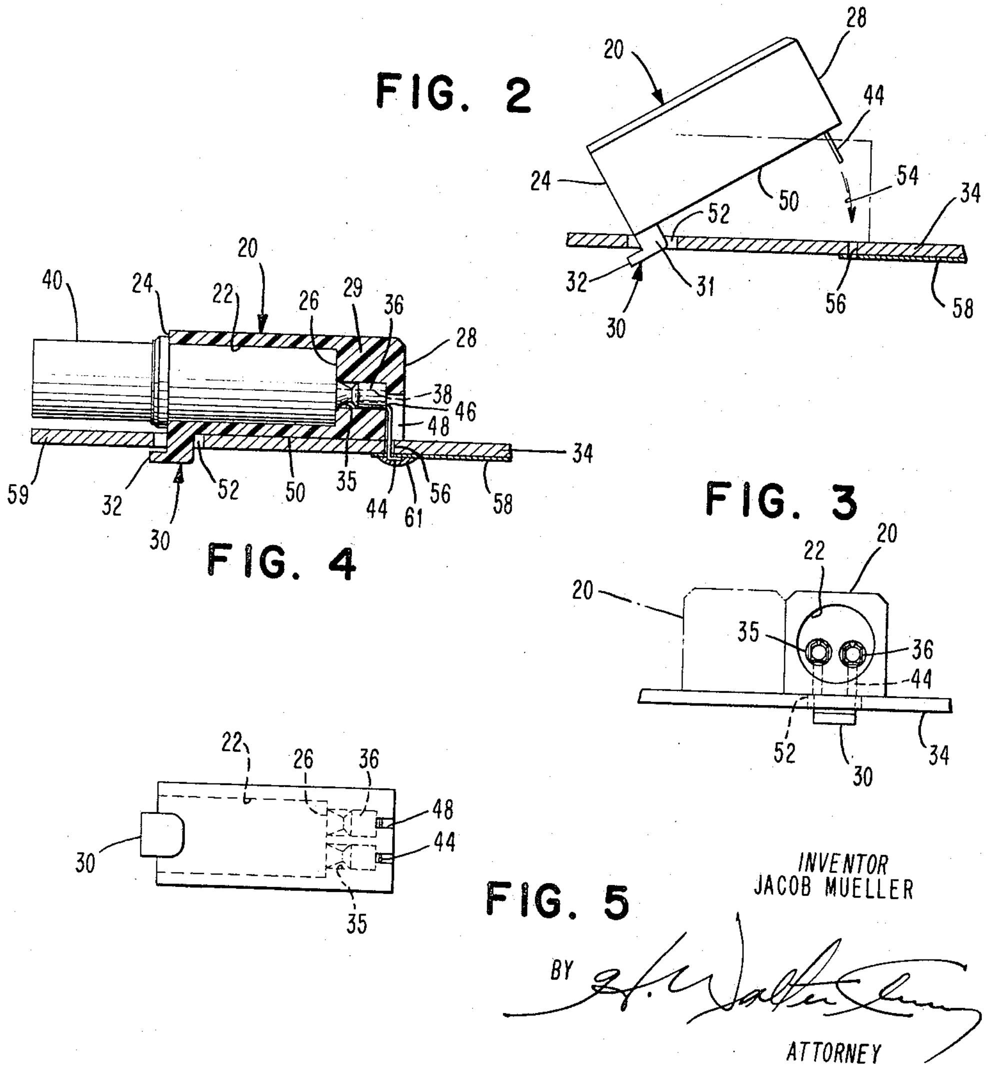
FIGURE 2 is a side view showing the method by which the lamp socket of this preferred embodiment of the invention is mounted on a printed circuit board.
FIGURE 3 is a front end view of the lamp socket.
FIGURE 4 is a longitudinal view taken along the line 4—4 of FIGURE 3 but with a lamp in the socket.
FIGURE 5 is a bottom plan view of the socket removed from the printed circuit board.

One advantage of having the hooks 60 (in FIGURES 8 and 9) and the hook 30 (in FIGURES 1–5) lie between the planes of the side walls of the socket, is that two or more of the sockets may be mounted beside each other, sidewall against sidewall, as shown in FIGURE 3, thus to conserve space on the boards.

It should be understood that while only one lamp receiving bore is shown, the socket easily could be provided with more by expanding its side to side dimension.

The embodiments of the invention in which an exclusive property or privilege is claimed are defined as follows:

1. A lamp socket for printed circuit boards comprising:
   (A) an elongated unitary body member formed of electrically insulating material, and having
      (a) a bore extending partially therethrough from one end and along its length to bottom at an end wall at its other end,
      (b) recesses extending into said end wall from the bottom of said bore and terminating in open communication with slots formed in the outer surface of said end wall from the bottom wall of said body member, and
      (c) hook means adjacent said one end to extend through a hole in said board and grip the board to secure said socket thereto; and
   (B) connector means positioned in said recesses with tail elements projecting into said slots and extending therethrough substantially at right angles to the length of said body member to terminate as extensions from said bottom wall for connection to wiring on said printed circuit board.

2. A lamp socket according to claim 1 wherein:
   (A) said hook means comprises a short leg portion depending from the bottom front edge of said body member and having a forwardly extending foot portion.

3. A lamp socket according to claim 2 wherein said hook depends from the center of said front edge.

4. A lamp socket according to claim 2 wherein said foot portion is spaced from said bottom wall a distance substantially equal to the thickness of the circuit board.

5. A lamp socket according to claim 1 wherein said bottom wall is slotted along the length of said bore thereby rendering the side walls of said body member flexible, and said hook means comprises a pair of short leg portions, one depending from the bottom front edge of said body member on each side of said slot, each of said leg portions having an outwardly extending foot portion for gripping the underside of said board after said side walls have been flexed inwardly and said hooks passed through an aperture in said board and the side walls released to return to their normal unflexed condition.

6. A construction according to claim 5 wherein said hooks depend from the outer ends of said bottom front edge and their foot portions project beyond the side walls of said body member.

7. A construction according to claim 5 wherein said hooks depend from the inner ends of the portions of said bottom front edge formed by the slot, and said foot portions are between the side walls of said body member.

References Cited

UNITED STATES PATENTS

| | | | |
|---|---|---|---|
| 2,958,065 | 10/1960 | Flanagan | 339—17 |
| 2,979,554 | 4/1961 | Maitland | 174—138 |
| 3,030,604 | 4/1962 | Moody | 339—125 X |
| 3,148,010 | 9/1964 | Woodward | 339—17 X |
| 3,179,912 | 4/1965 | Huber et al. | 339—17 |

MARVIN A. CHAMPION, *Primary Examiner.*

PATRICK A. CLIFFORD, *Examiner.*